(12) United States Patent
Patel (10) Patent No.: US 12,498,644 B2
(45) Date of Patent: Dec. 16, 2025

(54) METHOD AND APPARATUS FOR IDENTIFYING POSITIONS OF A SPATIAL LIGHT MODULATOR RELATIVE TO A TEMPLATE EDGE

(71) Applicant: CANON KABUSHIKI KAISHA, Tokyo (JP)

(72) Inventor: Mehul N. Patel, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 299 days.

(21) Appl. No.: 18/064,158

(22) Filed: Dec. 9, 2022

(65) Prior Publication Data
US 2024/0192612 A1 Jun. 13, 2024

(51) Int. Cl.
G03F 9/00 (2006.01)
G02B 26/08 (2006.01)
G03F 7/00 (2006.01)

(52) U.S. Cl.
CPC ....... *G03F 9/7042* (2013.01); *G02B 26/0833* (2013.01); *G03F 7/0002* (2013.01); *G03F 9/7065* (2013.01)

(58) Field of Classification Search
CPC .......................... G03F 9/7065; G02B 26/0833
See application file for complete search history.

(56) References Cited

U.S. PATENT DOCUMENTS

| | | | |
|---|---|---|---|
| 6,428,940 B1* | 8/2002 | Sandstrom | G03F 7/70291 430/311 |
| 6,870,554 B2 | 3/2005 | Jain | |
| 6,922,483 B2 | 7/2005 | Doane | |
| 7,557,932 B2 | 7/2009 | Doan et al. | |
| 7,889,411 B2 | 2/2011 | Latypov | |
| 7,936,445 B2 | 5/2011 | Hintersteiner et al. | |
| 12,099,295 B2* | 9/2024 | Koide | G05B 13/00 |
| 2012/0085919 A1* | 4/2012 | Kojima | G03F 7/70291 250/396 R |
| 2017/0144363 A1 | 5/2017 | Nakagawa | |
| 2018/0301331 A1 | 10/2018 | Yoshida | |
| 2020/0292935 A1 | 9/2020 | Yoshida | |
| 2020/0310247 A1* | 10/2020 | Murasato | G03F 7/0002 |

FOREIGN PATENT DOCUMENTS

| | | | |
|---|---|---|---|
| DE | 102010003608 A1 * | 11/2011 | G01M 11/005 |
| WO | 2015/052323 A1 | 4/2015 | |

OTHER PUBLICATIONS

Web, Image Quality Factors, Distortion, TV distortion method (ISO 939), web page, Oct. 20, 2020, Image Engineering GmbH & Co, retrieved from Internet Archive Wayback Machine, https://web.archive.org/web/20201020175253/https://www.image-engineering.de/library/image-quality/factors/1062-distortion.
U.S. Appl. No. 17/407,786, filed Aug. 20, 2021.
U.S. Appl. No. 17/560,597, filed Dec. 23, 2021.

* cited by examiner

*Primary Examiner* — Atul P. Khare
(74) *Attorney, Agent, or Firm* — Canon U.S.A., Inc. IP Division (57) ABSTRACT

A method for identifying pixels corresponding to an imprint field edge. Generating a set of pixel patterns, each pixel pattern from the set of pixel patterns including edge pixels predicted to be near the imprint field edge of a test imprint field and central pixels corresponding to a center portion of the test imprint field, wherein the edge pixels are turned on, each pixel pattern from the set of pixel patterns having different edge pixels selected and imprinting the test imprint field with a spatially modulated light source that is modulated with at least one pixel pattern from the set of pixel patterns.

17 Claims, 9 Drawing Sheets

| | A | S | T | U | V | W | X | Y | Z | AA | AB | AC | AD | AE | AF | AG | AH |
|---|---|---|---|---|---|---|---|---|---|---|---|---|---|---|---|---|---|
| 1 | # | | | | | | | | | | | | | | | | |
| 2 | #node illu | | | | | | | | | | | | | | | | |
| 3 | # | | | | | | | | | | | | | | | | |
| 4 | Date | | | | | | | | | | | | | | | | |
| 5 | Msg | | | | | | | | | | | | | | | | |
| 6 | | -13.164 | -13.098 | -13.032 | -12.966 | -12.9 | -12.834 | -12.768 | -12.702 | -12.636 | -12.57 | -12.504 | -12.438 | -12.372 | -12.306 | -12.24 | -12.174 |
| 62 | 15.662 | 0 | 1 | 0 | 0 | 0 | 0 | 0 | 0 | 0 | 0 | 0 | 0 | 1 | 1 | 1 | 1 |
| 63 | 15.596 | 0 | 1 | 0 | 0 | 0 | 0 | 0 | 0 | 0 | 0 | 0 | 0 | 1 | 1 | 1 | 1 |
| 64 | 15.53 | 0 | 1 | 0 | 0 | 0 | 0 | 0 | 0 | 0 | 0 | 0 | 0 | 1 | 1 | 1 | 1 |
| 65 | 15.464 | 0 | 1 | 0 | 0 | 0 | 0 | 0 | 0 | 0 | 0 | 0 | 0 | 1 | 1 | 1 | 1 |
| 66 | 15.398 | 0 | 1 | 0 | 0 | 0 | 0 | 0 | 0 | 0 | 0 | 0 | 0 | 1 | 1 | 1 | 1 |
| 67 | 15.332 | 0 | 1 | 0 | 0 | 0 | 0 | 0 | 0 | 0 | 0 | 0 | 0 | 1 | 1 | 1 | 1 |
| 68 | 15.266 | 0 | 1 | 0 | 0 | 0 | 0 | 0 | 0 | 0 | 0 | 0 | 0 | 1 | 1 | 1 | 1 |
| 69 | 15.2 | 0 | 1 | 0 | 0 | 0 | 0 | 0 | 0 | 0 | 0 | 0 | 0 | 1 | 1 | 1 | 1 |
| 70 | 15.134 | 0 | 1 | 0 | 0 | 0 | 0 | 0 | 0 | 0 | 0 | 0 | 0 | 1 | 1 | 1 | 1 |
| 71 | 15.068 | 0 | 1 | 0 | 0 | 0 | 0 | 0 | 0 | 0 | 0 | 0 | 0 | 1 | 1 | 1 | 1 |
| 72 | 15.002 | 0 | 1 | 0 | 0 | 0 | 0 | 0 | 0 | 0 | 0 | 0 | 0 | 1 | 1 | 1 | 1 |
| 73 | 14.936 | 0 | 1 | 0 | 0 | 0 | 0 | 0 | 0 | 0 | 0 | 0 | 0 | 1 | 1 | 1 | 1 |
| 74 | 14.87 | 0 | 1 | 0 | 0 | 0 | 0 | 0 | 0 | 0 | 0 | 0 | 0 | 1 | 1 | 1 | 1 |
| 75 | 14.804 | 0 | 1 | 0 | 0 | 0 | 0 | 0 | 0 | 0 | 0 | 0 | 0 | 1 | 1 | 1 | 1 |
| 76 | 14.738 | 0 | 1 | 0 | 0 | 0 | 0 | 0 | 0 | 0 | 0 | 0 | 0 | 1 | 1 | 1 | 1 |
| 77 | 14.672 | 0 | 1 | 0 | 0 | 0 | 0 | 0 | 0 | 0 | 0 | 0 | 0 | 1 | 1 | 1 | 1 |
| 78 | 14.606 | 0 | 1 | 0 | 0 | 0 | 0 | 0 | 0 | 0 | 0 | 0 | 0 | 1 | 1 | 1 | 1 |
| 79 | 14.54 | 0 | 1 | 0 | 0 | 0 | 0 | 0 | 0 | 0 | 0 | 0 | 0 | 1 | 1 | 1 | 1 |

FIG. 4A

| | A | S | T | U | V | W | X | Y | Z | AA | AB | AC | AD | AE | AF | AG | AH |
|---|---|---|---|---|---|---|---|---|---|---|---|---|---|---|---|---|---|
| 1 | # | | | | | | | | | | | | | | | | |
| 2 | #node illu | | | | | | | | | | | | | | | | |
| 3 | # | | | | | | | | | | | | | | | | |
| 4 | Date | | | | | | | | | | | | | | | | |
| 5 | Msg | | | | | | | | | | | | | | | | |
| 6 | | -13.164 | -13.098 | -13.032 | -12.966 | -12.9 | -12.834 | -12.768 | -12.702 | -12.636 | -12.57 | -12.504 | -12.438 | -12.372 | -12.306 | -12.24 | -12.174 |
| 62 | 15.662 | 0 | 0 | 1 | 0 | 0 | 0 | 0 | 0 | 0 | 0 | 0 | 0 | 0 | 1 | 1 | 1 |
| 63 | 15.596 | 0 | 0 | 1 | 0 | 0 | 0 | 0 | 0 | 0 | 0 | 0 | 0 | 0 | 1 | 1 | 1 |
| 64 | 15.53 | 0 | 0 | 1 | 0 | 0 | 0 | 0 | 0 | 0 | 0 | 0 | 0 | 0 | 1 | 1 | 1 |
| 65 | 15.464 | 0 | 0 | 1 | 0 | 0 | 0 | 0 | 0 | 0 | 0 | 0 | 0 | 0 | 1 | 1 | 1 |
| 66 | 15.398 | 0 | 0 | 1 | 0 | 0 | 0 | 0 | 0 | 0 | 0 | 0 | 0 | 0 | 1 | 1 | 1 |
| 67 | 15.332 | 0 | 0 | 1 | 0 | 0 | 0 | 0 | 0 | 0 | 0 | 0 | 0 | 0 | 1 | 1 | 1 |
| 68 | 15.266 | 0 | 0 | 1 | 0 | 0 | 0 | 0 | 0 | 0 | 0 | 0 | 0 | 0 | 1 | 1 | 1 |
| 69 | 15.2 | 0 | 0 | 1 | 0 | 0 | 0 | 0 | 0 | 0 | 0 | 0 | 0 | 0 | 1 | 1 | 1 |
| 70 | 15.134 | 0 | 0 | 1 | 0 | 0 | 0 | 0 | 0 | 0 | 0 | 0 | 0 | 0 | 1 | 1 | 1 |
| 71 | 15.068 | 0 | 0 | 1 | 0 | 0 | 0 | 0 | 0 | 0 | 0 | 0 | 0 | 0 | 1 | 1 | 1 |
| 72 | 15.002 | 0 | 0 | 1 | 0 | 0 | 0 | 0 | 0 | 0 | 0 | 0 | 0 | 0 | 1 | 1 | 1 |
| 73 | 14.936 | 0 | 0 | 1 | 0 | 0 | 0 | 0 | 0 | 0 | 0 | 0 | 0 | 0 | 1 | 1 | 1 |
| 74 | 14.87 | 0 | 0 | 1 | 0 | 0 | 0 | 0 | 0 | 0 | 0 | 0 | 0 | 0 | 1 | 1 | 1 |
| 75 | 14.804 | 0 | 0 | 1 | 0 | 0 | 0 | 0 | 0 | 0 | 0 | 0 | 0 | 0 | 1 | 1 | 1 |
| 76 | 14.738 | 0 | 0 | 1 | 0 | 0 | 0 | 0 | 0 | 0 | 0 | 0 | 0 | 0 | 1 | 1 | 1 |
| 77 | 14.672 | 0 | 0 | 1 | 0 | 0 | 0 | 0 | 0 | 0 | 0 | 0 | 0 | 0 | 1 | 1 | 1 |
| 78 | 14.606 | 0 | 0 | 1 | 0 | 0 | 0 | 0 | 0 | 0 | 0 | 0 | 0 | 0 | 1 | 1 | 1 |
| 79 | 14.54 | 0 | 0 | 1 | 0 | 0 | 0 | 0 | 0 | 0 | 0 | 0 | 0 | 0 | 1 | 1 | 1 |

FIG. 4B

| A | S | T | U | V | W | X | Y | Z | AA | AB | AC | AD | AE | AF | AG | AH |
|---|---|---|---|---|---|---|---|---|---|---|---|---|---|---|---|---|
| 1 #   #node illu | | | | | | | | | | | | | | | | |
| 2 # | | | | | | | | | | | | | | | | |
| 3 Date | | | | | | | | | | | | | | | | |
| 4 Msg | | | | | | | | | | | | | | | | |
| 5 | -13.164 | -13.098 | -13.032 | -12.966 | -12.9 | -12.834 | -12.768 | -12.702 | -12.636 | -12.57 | -12.504 | -12.438 | -12.372 | -12.306 | -12.24 | -12.174 |
| 6 | | | | | | | | | | | | | | | | |
| 62 15.662 | 0 | 0 | 0 | 1 | 0 | 0 | 0 | 0 | 0 | 0 | 0 | 0 | 0 | 0 | 1 | 1 |
| 63 15.596 | 0 | 0 | 0 | 1 | 0 | 0 | 0 | 0 | 0 | 0 | 0 | 0 | 0 | 0 | 1 | 1 |
| 64 15.53  | 0 | 0 | 0 | 1 | 0 | 0 | 0 | 0 | 0 | 0 | 0 | 0 | 0 | 0 | 1 | 1 |
| 65 15.464 | 0 | 0 | 0 | 1 | 0 | 0 | 0 | 0 | 0 | 0 | 0 | 0 | 0 | 0 | 1 | 1 |
| 66 15.398 | 0 | 0 | 0 | 1 | 0 | 0 | 0 | 0 | 0 | 0 | 0 | 0 | 0 | 0 | 1 | 1 |
| 67 15.332 | 0 | 0 | 0 | 1 | 0 | 0 | 0 | 0 | 0 | 0 | 0 | 0 | 0 | 0 | 1 | 1 |
| 68 15.266 | 0 | 0 | 0 | 1 | 0 | 0 | 0 | 0 | 0 | 0 | 0 | 0 | 0 | 0 | 1 | 1 |
| 69 15.2   | 0 | 0 | 0 | 1 | 0 | 0 | 0 | 0 | 0 | 0 | 0 | 0 | 0 | 0 | 1 | 1 |
| 70 15.134 | 0 | 0 | 0 | 1 | 0 | 0 | 0 | 0 | 0 | 0 | 0 | 0 | 0 | 0 | 1 | 1 |
| 71 15.068 | 0 | 0 | 0 | 1 | 0 | 0 | 0 | 0 | 0 | 0 | 0 | 0 | 0 | 0 | 1 | 1 |
| 72 15.002 | 0 | 0 | 0 | 1 | 0 | 0 | 0 | 0 | 0 | 0 | 0 | 0 | 0 | 0 | 1 | 1 |
| 73 14.936 | 0 | 0 | 0 | 1 | 0 | 0 | 0 | 0 | 0 | 0 | 0 | 0 | 0 | 0 | 1 | 1 |
| 74 14.87  | 0 | 0 | 0 | 1 | 0 | 0 | 0 | 0 | 0 | 0 | 0 | 0 | 0 | 0 | 1 | 1 |
| 75 14.804 | 0 | 0 | 0 | 1 | 0 | 0 | 0 | 0 | 0 | 0 | 0 | 0 | 0 | 0 | 1 | 1 |
| 76 14.738 | 0 | 0 | 0 | 1 | 0 | 0 | 0 | 0 | 0 | 0 | 0 | 0 | 0 | 0 | 1 | 1 |
| 77 14.672 | 0 | 0 | 0 | 1 | 0 | 0 | 0 | 0 | 0 | 0 | 0 | 0 | 0 | 0 | 1 | 1 |
| 78 14.606 | 0 | 0 | 0 | 1 | 0 | 0 | 0 | 0 | 0 | 0 | 0 | 0 | 0 | 0 | 1 | 1 |
| 79 14.54  | 0 | 0 | 0 | 1 | 0 | 0 | 0 | 0 | 0 | 0 | 0 | 0 | 0 | 0 | 1 | 1 |

FIG. 9

METHOD AND APPARATUS FOR IDENTIFYING POSITIONS OF A SPATIAL LIGHT MODULATOR RELATIVE TO A TEMPLATE EDGE

BACKGROUND OF THE DISCLOSURE

Field of the Disclosure

The present disclosure relates to nanoimprint lithography. In particular, a method for identifying positions of a spatial light modulator relative to a template edge.

Description of the Related Art

Nanoimprint lithography for semiconductor fabrication has become increasingly popular. It has been used in a variety of fabrication processes including layers of integrated circuit devices such as memory devices, microprocessors, and logic circuits. One such system uses spatial light modulation to modulate a radiation source to irradiate a formable material near an edge of an imprint field on a substrate to increase the viscosity of resist spreading under the template. Light modulation can be performed by a number of techniques that use a spatial light modulator (SLM), including Digital Micromirror/Mirror Device (DMD), Liquid Crystal Device (LCD), mirror array, etc.

The Digital Micromirror/Mirror Device (DMD) is an optical micro-electrical-mechanical system (MEMS) that contains an array of highly reflective micro mirrors to perform digital spatial modulation (DSM). Specially designed optics are used to provide accurate curing in lithography imprinting systems.

One step in the fabrication process is to register the pixel locations relative to the imprint field edge. Existing techniques perform the registration by turning on and off individual mirrors. The SLM is important for extrusion control. Extrusions are cured formable material outside the imprint field edge that can result in downstream processing defects. Extrusion control refers to preventing or reducing extrusions from occurring during the imprinting process. The SLM is used for extrusion control in two ways: 1) an ambush method to gel the formable material as it approaches the mesa edge and 2) controlled curing to prevent curing of formable material outside the mesa edge. In each method for extrusion control, the SLM pixels corresponding to the imprint field edge must be accurately identified for a particular template. Initial SLM registration can provide an estimate for which SLM pixels correspond to the imprint field edge, but distortion from the optical path means that often estimates of SLM pixels corresponding to the imprint field edge are incorrect. Incorrect SLM pixel selection for extrusion control may lead to non-fill or extrusions.

SUMMARY

An on-tool imprinting procedure for identifying the SLM pixels corresponding to an imprint field edge for a particular template for effective extrusion control.

A method for identifying pixels corresponding to an imprint field edge including generating a set of pixel patterns, each pixel pattern from the set of pixel patterns including edge pixels predicted to be near the imprint field edge of a test imprint field and central pixels corresponding to a center portion of the test imprint field, wherein the edge pixels are turned on, each pixel pattern from the set of pixel patterns having different edge pixels selected; and imprinting the test imprint field with a spatially modulated light source that is modulated with at least one pixel pattern from the set of pixel patterns.

Further features of the disclosure will become apparent from the following description of exemplary embodiments with reference to the attached drawings.

DESCRIPTION OF THE EMBODIMENTS

The present disclosure is directed to an on-tool imprint procedure for accurately identifying SLM pixels corresponding to an imprint field edge for a particular template for effective extrusion control. Throughout the present disclosure the exemplary embodiment refers to identifying DMD pixels, however, the present disclosure is applicable to other devices besides DMD and the term pixels is used interchangeably with DMD pixels. The present disclosure relates to performing registration of a SLM relative to a template mesa. A formable material in contact with the template mesa is irradiated to form a reference film using a predefined registration pattern associated with a spatial light modulator (SLM). The reference film is inspected to generate positional information of elements of the SLM relative to an imprint field edge. In an embodiment, the reference film from multiple imprints are inspected with an on tool optical microscope to inspect the cured edges of the reference imprint fields.

Figure 1:
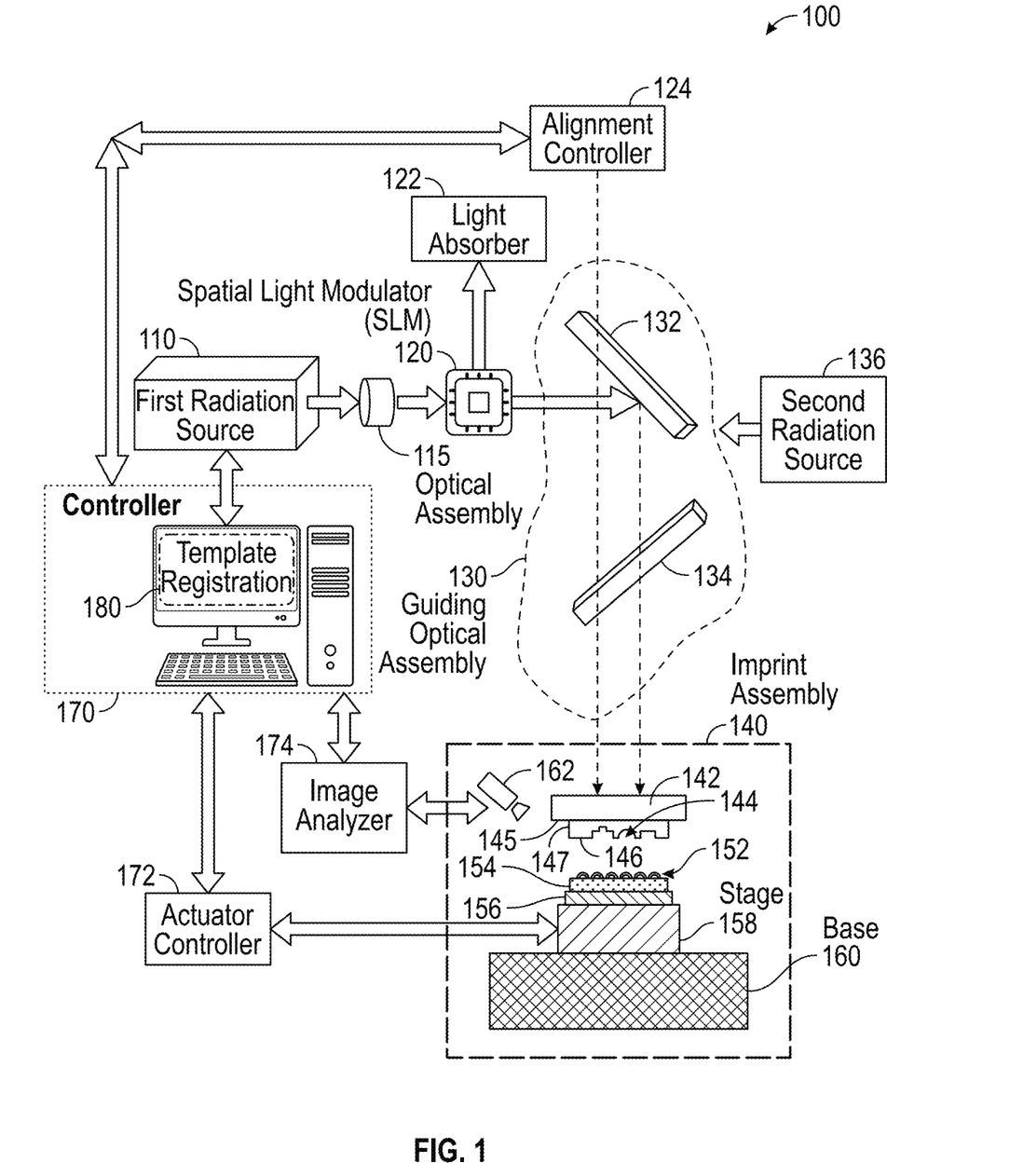
FIG. 1 is a diagram illustrating a system for SLM registration.

FIG. 1 is a diagram illustrating a system for SLM registration in imprint lithography. The system 100 includes a first radiation source 110, an optical assembly 115, an SLM 120, a guiding optical assembly 130, a second radiation source 136, an imprint assembly 140, and actuator controller 172, and an image analyzer 174. The system 100 may include more or less than the above components. For example, the second radiation source 136 may not be needed.

The first radiation source 110 radiates actinic energy for curing a formable material in the imprint assembly 140 through the SLM 120 and the guiding optical assembly 130. The energy source may supply ultra-violet (UV) light. The optical assembly 115 receives the light energy at the end of the exposure path and directs the energy through a system of optical components to the SLM 120 to irradiate the photo-curable or formable material in the imprint assembly 140. It may include lenses that are designed and positioned at positions to achieve the proper modulation for the light source. The guiding optical assembly 130 may magnify the pattern from the SLM 120 by a magnification factor prior to projecting the pattern through the template and onto the substrate in the imprint assembly 140.

The imprint assembly 140 includes components used for nanoimprint lithography. It includes a template 142 having a template pattern 144 and a mesa 146, a formable material 152, a substrate 154, a substrate chuck 156, a substrate positioning stage 158 that holds the substrate chuck or substrate holder 156 and the substrate 154 on which a patterned layer is formed, and an image sensor 162. The substrate holder 156 holds the substrate 154. A template holder (not shown) holds the template 142. The substrate 154 includes a plurality of imprint fields. The stage 158 is positioned above a base 160. The imprint assembly 140 may also include other components which are not shown for clarity. These components include a control and sensing assembly to perform control and sensing functions for the imprinting on the substrate, a field camera to provide images of the spread of the formable material and to keep track of the imprinting process, a droplet inspection system to inspect droplets. The template 142 may be made from a material such as fused silica, quartz, silicon, organic polymers, or other suitable materials. The template pattern 144 includes features that have recesses and protrusions corresponding to the pattern to be formed on the substrate 154. In an alternative embodiment, the template pattern 142 is featureless which is used to form a planarized surface on the substrate 142. The mesa 146 may be surrounded by a recessed surface 145 on the front side of the template 142. Mesa sidewalls 147 connect the recessed surface 145 to the surface of the pattern 144. One objective of the embodiment is to generate the SLM registration with respect to the mesa 146. The term registration here refers to the correspondence between the individual mirrors (or also loosely called "pixels") in the SLM 120 (when the SLM is a DMD) and the locations of the individual areas on the mesa 146.

The substrate 154 may be coated with a thin adhesion layer to help in the adhesion of the photo-curable or formable material 152 after curing to the substrate 154. The substrate 154 may be held by the substrate chuck 156 and both are positioned by the stage 158. The stage 158 may be controlled by an actuator controller 172 to move the substrate and substrate chuck assembly. The photo-curable formable material 152 may be used to transfer the template pattern 144 to the semiconductor substrate 154. The formable material 152 may be a resist that takes on an inverse of shapes on a patterning surface from a mold and/or a template. The formable material 152 may be cured by the energy provided by the radiation source while the template pattern 144 is in contact with the formable material 152 on the substrate 154. In an embodiment, after the photo-curable or formable material 152 is cured additional semiconductor manufacturing processing may be performed on the substrate 154 in a processing step so as to create an article of manufacture (e.g. semiconductor device). In an embodiment, each field includes a plurality of devices. The further semiconductor manufacturing processing in the processing step may include etching processes to transfer a relief image into the substrate that corresponds to the template pattern 138 in the patterned layer or an inverse of that template pattern 144. The further processing in the processing step may also include known steps and processes for article fabrication, including, for example, inspection, curing, oxidation, layer formation, deposition, doping, planarization, etching, formable material removal, dicing, bonding, packaging, and the like. The substrate 154 may be processed to produce a plurality of articles (devices).

The SLM 120 is a device that contains an array of spatial elements to modulate the spatio-temporal distribution of the actinic radiation from the radiation source 110. The SLM 120 may also modulate the spatio-temporal distribution of the thermal radiation from a thermal radiation source (not shown) which may be used to cause the thermal expansion of one or both of the substrate and template. The spatial elements may be arranged in a two-dimensional array with a pitch, which is the smallest distance between centers of two adjacent spatial elements. In one embodiment, the SLM 120 is a digital micromirror device (DMD). The spatial elements are the pixels and the pitch is the pixel pitch. In an alternative embodiment, the SLM 120 is a transmissive liquid crystal device in which the transmissivity of each of the spatial elements is adjustable. In an alternative embodiment, the SLM 120 is a reflective liquid crystal on silicon device in which the reflectivity of each of the spatial elements is adjustable.

The image sensor 162 obtains an image of the result of the imprinting during calibration. In one embodiment, this result of the imprinting is the reference film produced after the curing process supplied by the SLM 120. The image sensor 162 is controlled by the image analyzer 174. The image analyzer 174 may include specialized hardware components such as memory, signal processor, etc. to perform image analysis on an image of the reference film.

The controller 170 is a computing subsystem that performs control functions for the system. These control functions include, but are not limited to, the following: template registration 180, image analysis, stage positioning (for the stage 158), alignment controller 124, and various control functions such as radiation source control. The architecture of the controller 170 will be discussed in FIG. 9.

The second radiation source 136 provides an additional actinic radiation source. The radiation emitted from the second radiation source 136 is guided by the guiding optical assembly 130 which may include appropriate optical components such as the mirrors 132 and 134, filters, lenses, prisms, beam combiners, etc.

The SLM 120 may include a plurality of elements or pixels. These pixels are individually controlled by the controller 170. In one embodiment, the SLM 120 is a DMD. In this system. A pixel may have two states: ON and OFF. The ON state is the active state in which the radiation is directed to irradiate the formable material 152. In the OFF state, no curing is performed. When the SLM 120 is implemented by a DMD, the individual micromirrors in the DMD are controlled to deflect the light to two optical paths. One path corresponds to the ON state and is directed to the substrate 154. One path corresponds to the OFF state in which the reflected light is directed to a light absorber or beam dump 122. Accordingly, changing the state of a pixel is to move the micromirror from a first angle to a second angle.

Figure 2:
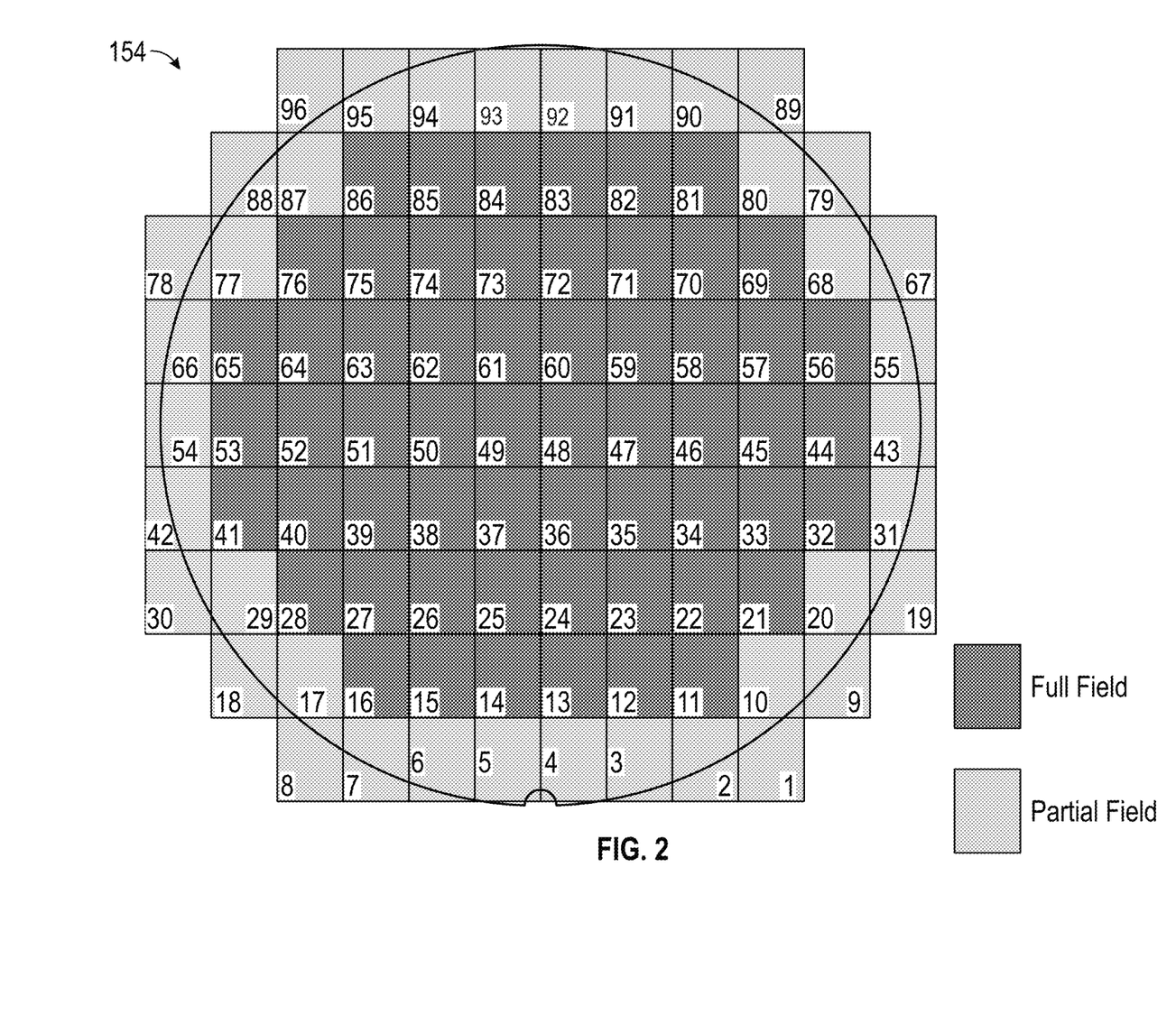
FIG. 2 is a diagram illustrating a wafer with a plurality of imprint fields.

FIG. 2 is a diagram illustrating an exemplary substrate 154 below a template 142. The substrate 154 includes a plurality of imprint fields. In this example there are 96 imprint fields associated with the mesa 146 on the substrate 154. The present disclosure is directed to identifying positions of spatial elements such as pixels or DMD pixels relative to the template mesa edge.

The substrate includes two types of imprint fields: full fields and partial fields. The partial imprint fields intersect with the perimeter of the substrate 154 are not included in the procedure to identify SLM pixels corresponding to the mesa edges. The imprint fields that may be included in the procedure to identify SLM pixels for the template field edge are completely within the perimeter of the substrate 154 (full fields). The imprint fields that may be included in the on-tool procedure for identifying the SLM pixels near the template edge include the full fields illustrated in FIG. 2 by way of example.

Figure 3:
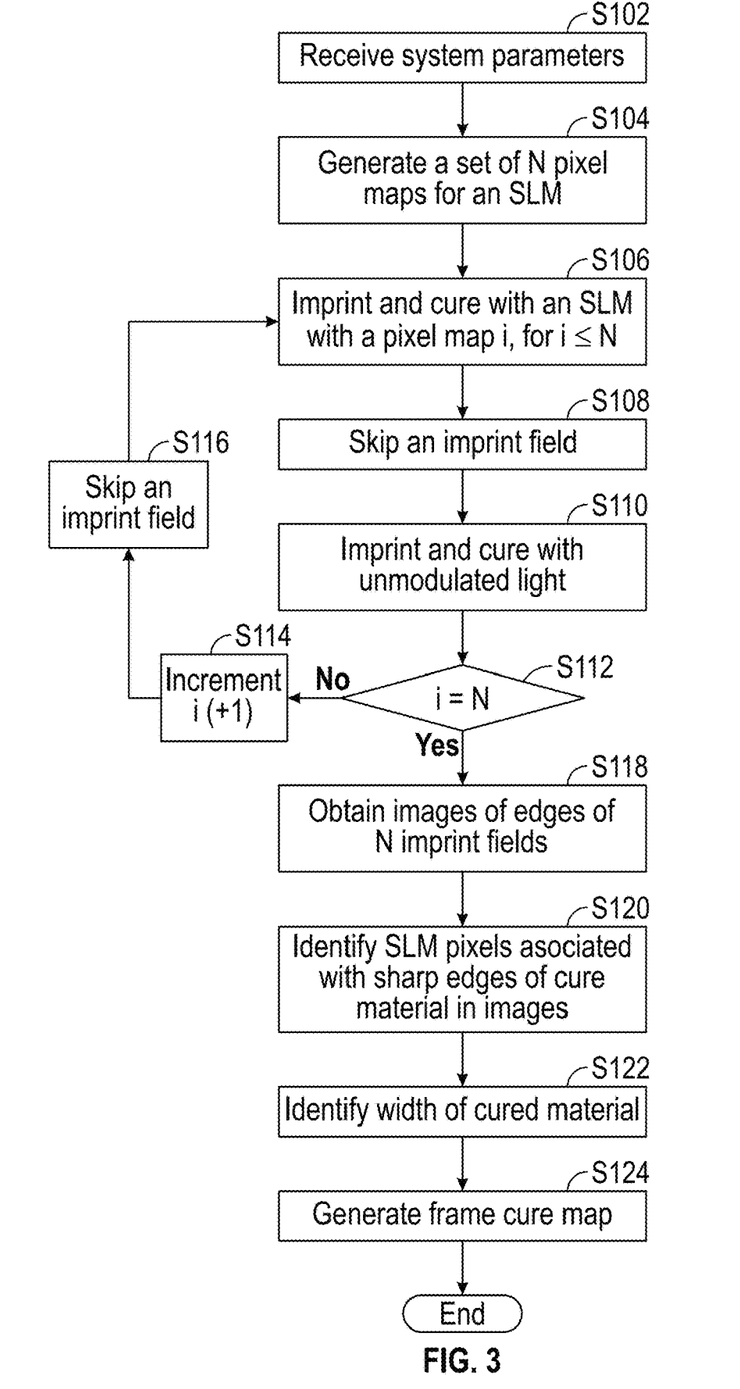
FIG. 3 is a flowchart illustrating a process to identify SLM pixels located at an imprint field edge in accordance with the present disclosure.

FIG. 3 is a flowchart illustrating various steps for performing a method of identifying positions of pixels relative to a mesa edge in accordance with an aspect of the present disclosure. The flowchart may represent some operations that are performed by the controller 170 by executing a program stored in memory as will be shown in FIG. 9. In step S102, the method may initiate by receiving system parameters. The system parameters received in step S102 provide initial SLM registration for estimating which of the SLM pixels correspond to the imprint field edge. The SLM pixel locations are estimated from initial hardware setup. However, the initial SLM registration based on the system parameters are typically inaccurate due to distortion from the optical path and process variations in positions of the mesa sidewalls 147. The initial SLM registration from the system parameters provides a good starting point for finding the exact SLM pixels corresponding to the imprint field edge for a particular template. It should be noted that relying on the initial SLM registration to estimate SLM pixels corresponding to the imprint field edge may result in incorrect SLM pixel selection for extrusion control leading to non-fill or extrusions.

After step S102, the method continues with step S104 generating a set of N pixel maps for an SLM. Each pixel map may be represented by an array of values on the order of a million elements (for example 0.7-4 million) depending on the number of pixels in the SLM. The set of SLM pixel maps that are generated can include between 5 and 10 maps in a set. This is by way of example and more or less pixel maps may be utilized based on user preference. However, a set of 5 to 10 SLM pixel maps is a preferred amount. The rows and/or columns are varied for the set of SLM pixel maps to find the exact pixel correlating to the imprint field edge based on the template shape (e.g., rectangular, square, polygon or jigsaw). The SLM pixel maps may be generated based on selecting 5 rows and/or columns outward and 5 rows and/or columns inward from the estimated perimeter or row/column that is based on initial hardware setup including field origin and pixel pitch.

The SLM pixel maps are similar to Excel® spreadsheets with each cell representing one pixel on the SLM. The rows and columns can be labeled with an approximate location relative to the imprint field (x, y) based on a prior registration procedure. Typically, the difference between each row/column (x, y) is the pixel pitch of the system, and the reference is from the center of the imprint field. However, this labeling for the SLM pixels may be incorrect towards the imprint field edges due to distortion that occurs through the optical path, theta rotation of the SLM, or theta rotation of the template. Hence, even though a SLM pixel is labeled with an x, y corresponding to the imprint field edge, optical distortion, mesa offset, or theta rotation makes it so that the actual location on the imprint field is different. For extrusion control, the SLM pixels which align with the imprint field edge are of critical importance. Incorrect SLM pixel selection can lead to either non-fill defects or extrusion defects.

Figure 4A:
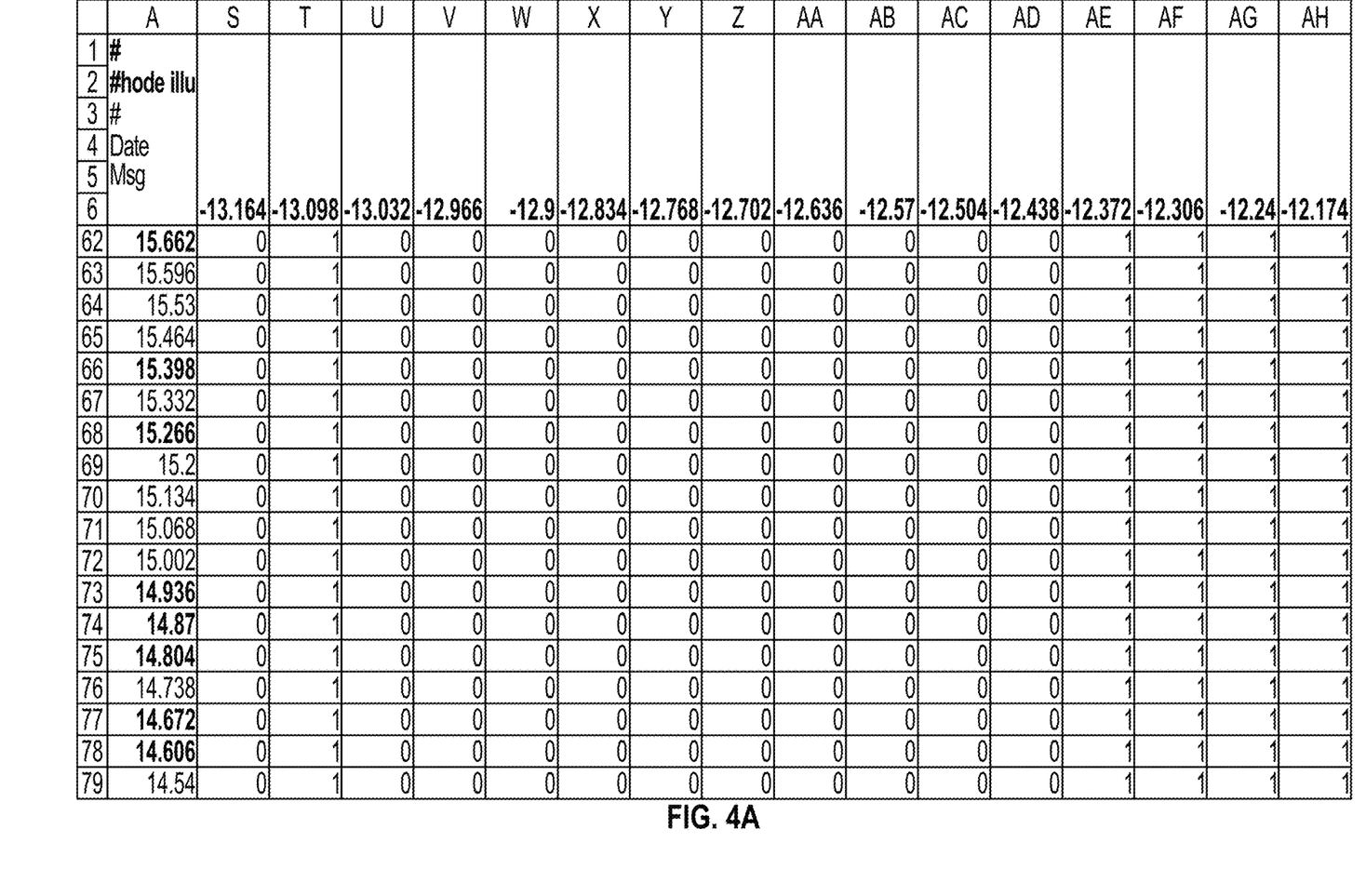
FIGS. 4A-4C are diagrams illustrating exemplary pixel maps for determining which SLM pixels exactly correspond to the imprint field edge in accordance with the present disclosure.
Figure 4B:
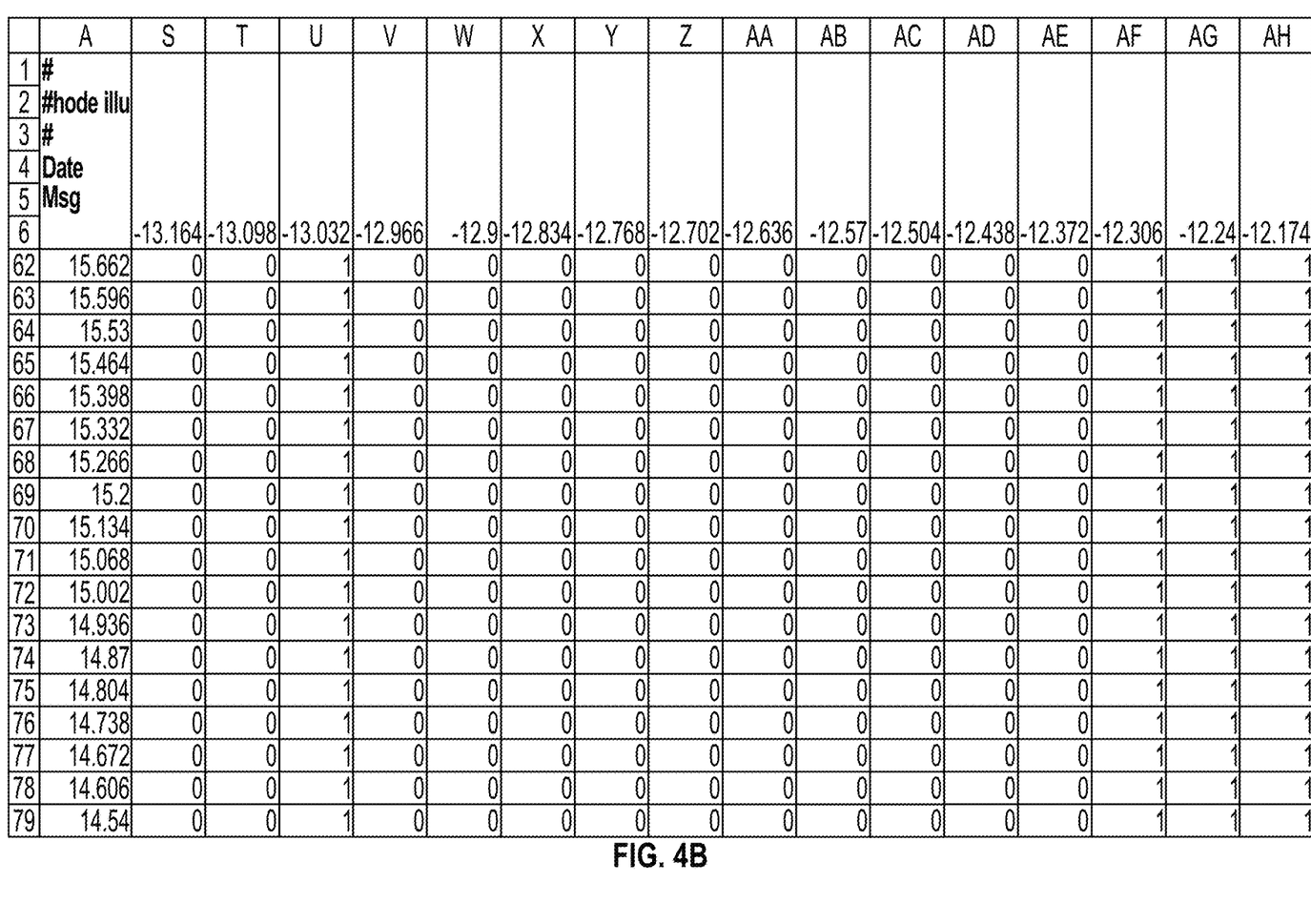
Figure 4C:
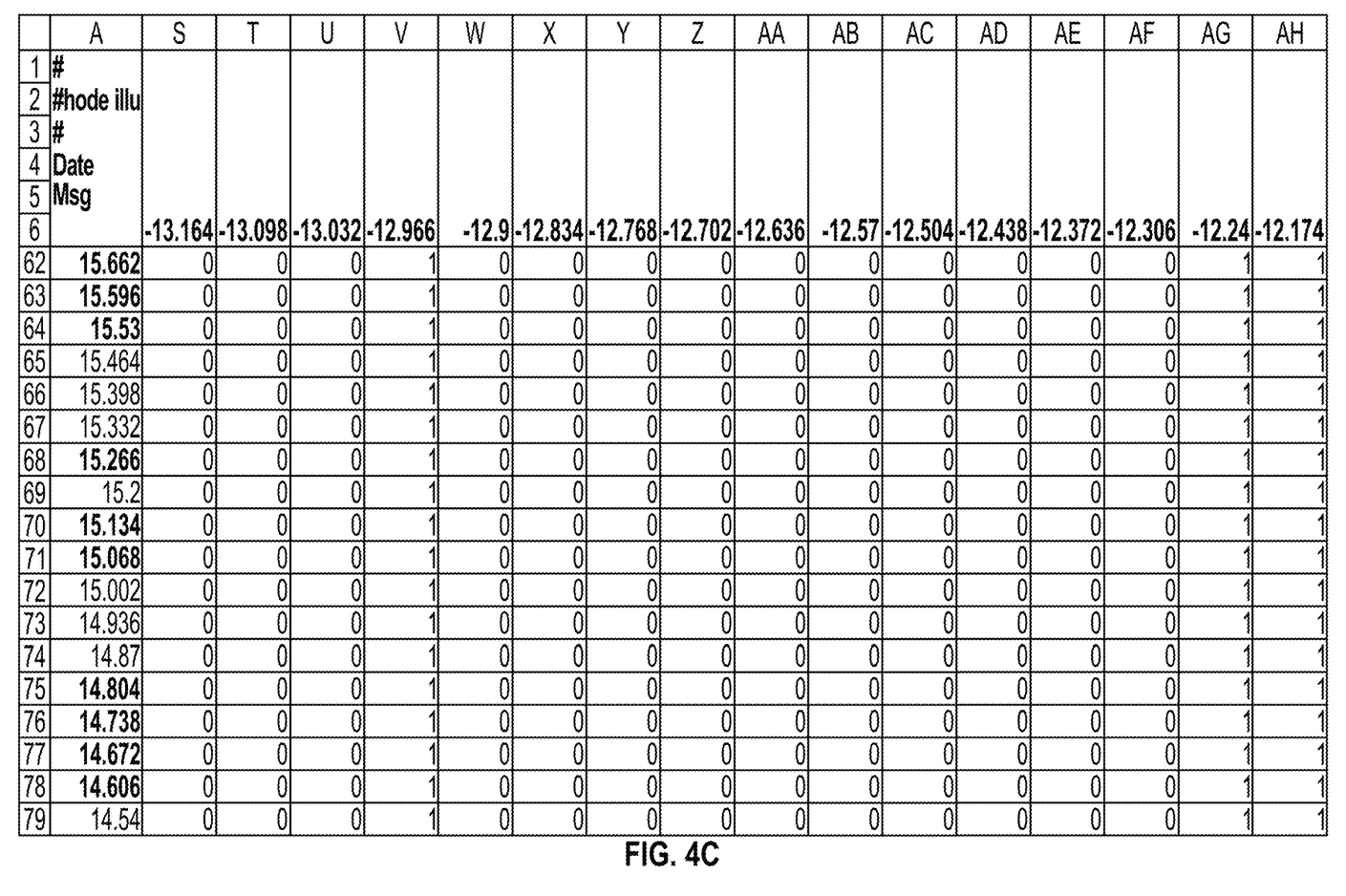

Referring now to FIGS. 4A-4C, FIGS. 4A-4C are diagrams illustrating exemplary pixel maps in accordance with the present disclosure. FIGS. 4A-4C the SLM pixel map columns T, U and V, respectively, are turned on to find which pixels correlate to the imprint field left edge. After that column, the next 10 columns are turned off followed by the remaining columns turned on until the opposite edge is reached and a similar pattern can be repeated for the right edge. FIG. 4A is a diagram illustrating a pixel map corresponding to a spreadsheet, where columns S through AH and rows 62 through 79 represent a section or portion of an imprint field. The numbers in row 6, columns S through AH represent X coordinates on the X-axis of the imprint field. The numbers in column A, rows 62 through 79 represent the Y coordinates on the Y-axis of the imprint field. The center of the imprint field has the coordinates (0,0). In this example, SLM pixels in column T are turned on to locate the imprint field left edge. The value 1 in column T refers to a pixel being turned on and set to cure for a full amount of time that is predetermined. For example if curing time is set to 5 seconds, a value of 1 corresponds to turning the pixel on for the full 5 seconds for curing. Whereas a value of 0 keeps the pixel off. Any value between 0 and 1 represents a fraction of the full curing time. For example if the pixel were turned on to 0.5, this would represent a curing time of 2.5 seconds if the full curing time is set to 5 seconds. Note that the SLM pixels are typically used for increasing viscosity and the duration for turning on the pixels for this purpose is for fractions of a second while for curing the pixel may be turned on for a longer period of time. It is important to note that the full curing time is merely an exemplary amount and other curing times may be considered. In the spreadsheet of FIG. 4A column S is set to 0 (turned off) and columns U through AD are turned off as well. This is so 10 pixels between the left edge SLM pixel (column T) and interior (or central) pixels (column AE) are turned off. The 10 pixels off between the template edge and the interior provide a sufficient gap to clearly identify the pixel location and pixel size relative to the imprint field edge. A width of 10 pixels on the X-axis between the left edge pixels and the interior pixels are merely by way of example and smaller or larger widths may be used in accordance with the present disclosure. The minimum number of off pixels between the edge and interior can be different (5 to 15) and can depend on the size and shape of the pixel. The pixels in columns AE through AH and so on are considered interior (or central) pixels and the interior SLM pixels are turned on to cure the formable material 152 during the imprint step to keep the template clean.

FIG. 4B represents the same portion of the imprint field as in FIG. 4A, however, the SLM pixels in the pixel map has been shifted to the right by one column. The SLM pixels in this pixel map are in column U and are turned on to locate the imprint field left edge. Similarly, a width of 10 pixels are turned off between the left edge SLM pixel (column U) and the interior pixels (column AF). The pixels in columns AF as well as the columns to the right of AF are turned on to keep the template clean.

FIG. 4C represents the same portion of the imprint field as in FIGS. 4A and 4B, except with a further shift of SLM pixels turned on to locate the imprint field edge. The SLM pixels in this pixel map are in column V. Similarly, a width of 10 pixels are turned off between the left edge SLM pixel (column V) and the interior pixels (column AG). The pixels in columns AG as well as the columns to the right of AG are turned on to keep the template clean. In this example, three spreadsheets representing three different possible locations for the SLM pixels that correspond to the imprint field edge.

Preferably 10 pixel maps are generated (10 spreadsheets) to cover 5 rows/columns outward/inward from the estimated perimeter row/column.

Referring back to the flowchart of FIG. 3, after generating a set of N pixel maps for an SLM in step S104, the method continues to step S106 to imprint and cure with an SLM with pixel map i, for i≤N. Making imprints using the SLM pixel map in step S106 enables curing of the imprint field with the SLM (no unmodulated UV curing). A sufficient spread time should be used (e.g., 3 to 5 seconds) to allow for the imprint field edge to be fully filled with formable material 152. The purge gas environment (flow and purge time) should be high to minimize oxygen poisoning and evaporation of the formable material 152 at the imprint field edge. At the end of spread time, the imprint field is cured with the one of the generated SLM pixel map.

In step S108, an imprint field is skipped to ensure that adjacent fields are not cured so that there is a sufficient gap between all the imprints. The purpose of skipping fields is so that a test field does not have an adjacent imprint field to ensure that there is no stray light from the next imprint impacting the previous imprint. In an embodiment, when fields are not adjacent means that the fields do not share any edges. In an alternative embodiment, when fields are not adjacent means that the fields do not share any edges or corners. In an alternative embodiment, the test and recovery fields are arranged to have large gaps between them that are of sufficient size to prevent curing of resist in neighboring fields.

Subsequently, in step S110, the method may continue with imprinting and curing of an imprint field with unmodulated light. In other words, after the imprint is complete, a "recovery" imprint with UV curing is initiated more than 1 field away from the SLM pixel map cured imprint to ensure that any uncured formable material 152 is removed from the template to keep it clean for the remaining SLM pixel map imprints. The applicant has found that curing with a test imprint field that has a gap can impact future imprints and that imprinting with a "recovery" imprint prevents previous imprints from influencing future test imprints. So, in summary, the imprinting process would be to imprint one field with a SLM pixel map, then in one embodiment, imprint one field with UV curing for recovering the template and repeat until all SLM pixel maps have been imprinted.

Next, in step S112, it is determined whether the current pixel map i that is being imprinted and cured is equal to the number of pixel maps in the set N. If it is determined in step S112 that i is less than N (No in step S112), the method continues with incrementing i by +1 in step S114, then skip imprint field in step S116 and return to step S106 to imprint and cure with an SLM with a pixel map of i+1. This loop ensures that the imprinting and cure with an SLM and imprint and cure with unmodulated light is applied to all the generated pixel maps. If it is determined in step S112 that i is equal to N (Yes in step S112), then the method proceeds to step S118 to obtain images of edges of N imprint fields. In an embodiment, the images of images of edges of N imprint fields are obtained with an on tool optical microscope 162.

Figure 5A:
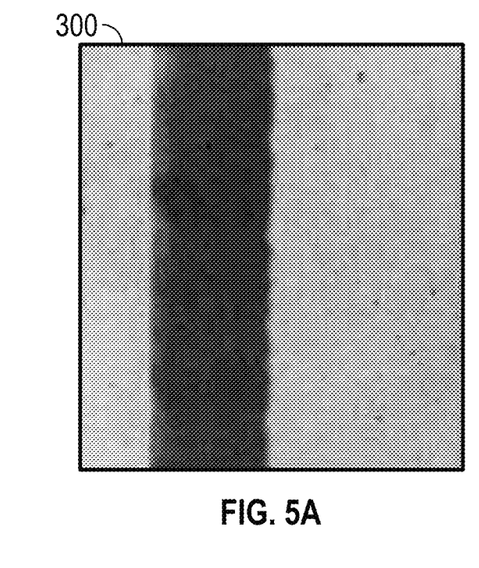
FIGS. 5A-5C are diagrams illustrating images showing SLM cured imprint for correlating imprint field left edge.
Figure 5B:
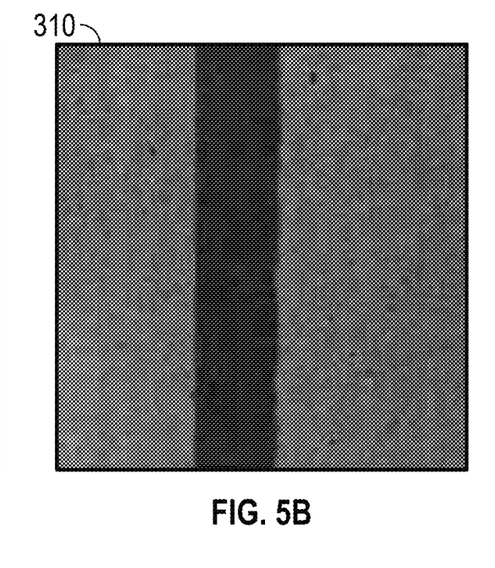
Figure 5C:
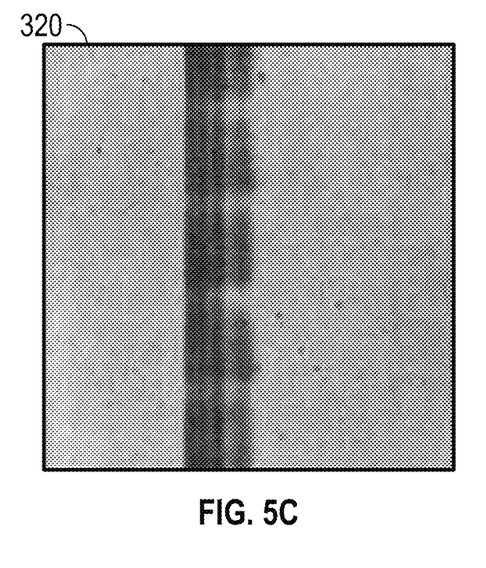

FIGS. 5A-5C are images showing SLM cured imprint for correlating imprint field left edge. In FIG. 5A, the image 300 of the imprint field left edge shows that the SLM pixels are slightly inside the left edge. This result allows the user of the lithography system to eliminate the pixel map associated with the image of FIG. 5A as the pixels corresponding to the left edge of the imprint field. In FIG. 5B, the image 310 of the imprint field left edge shows that the SLM pixels are aligned with the left edge. This result is what the user of the lithography tool would like to identify because the pixel map associated with the image 310 of FIG. 5B identifies the pixels corresponding to the left edge of the imprint field. In FIG. 5C, the image 320 of the imprint field left edge shows that the SLM pixels are outside the left edge indicated by the scattering from the mesa sidewall. This result allows the user of the lithography system to eliminate the pixel map associated with the image 320 of FIG. 5C as the pixels corresponding to the left edge of the imprint field.

Figure 6:
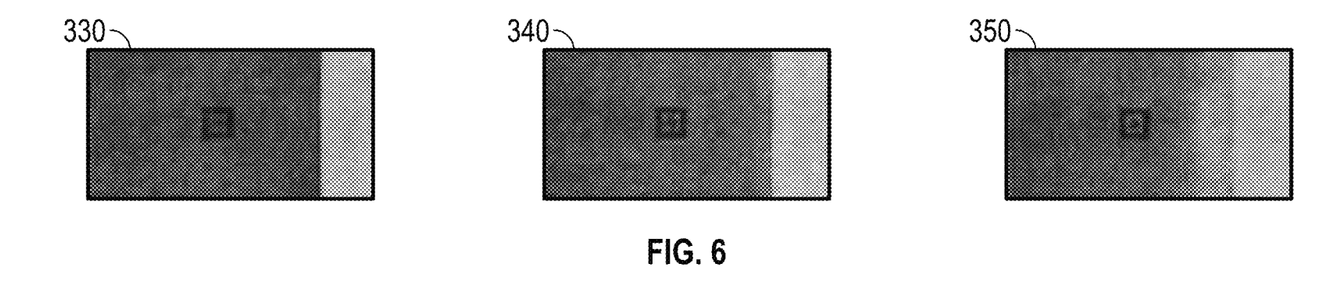
FIG. 6 is a diagram illustrating images showing SLM cured imprints for correlating imprint field right edge.

FIG. 6 are images that result from another embodiment of the present disclosure. In this embodiment, a different set of SLM pixel maps are generated. Instead of leaving a 10-pixel gap between the edge pixel and interior pixels, these "gap" pixels are turned on. In effect this alternate set of SLM pixel maps become smaller in size (or larger) to help identify the correct SLM pixel corresponding to the imprint field edge. As an example, FIG. 6 shows what the right imprint field edge would look like as the SLM pixel map decreases in size. The curing at the imprint edge decreases as the outermost SLM pixel column is turned off. One drawback to this variation is that the size of the SLM pixel at the edge cannot be ascertained. FIG. 6 are images showing SLM cured imprints for correlating imprint field right edge. From left to right, the outermost right column from the SLM pixel map decreases. The curing of the imprint field can be seen to decrease accordingly.

The left image 330 of the imprint field right edge shows that the SLM pixels are aligned with the imprint field right edge. This result is what a user seeks to identify the SLM pixels corresponding to the imprint field right edge. The center image 340 of the imprint field right edge shows the outermost right column from the SLM pixel map slightly decreases. This result allows the user of the lithography tool to eliminate the pixel map associated with the center image 340 as the pixels corresponding to the imprint field right edge. In the right most image 350 of the imprint field right edge shows that the SLM pixels decreases more than the center image 340. This result allows the user of the lithography tool to eliminate the pixel map associated with the right most image 350 as the pixels corresponding to the imprint field right edge.

Referring back to the flowchart of FIG. 3, after step S118 of obtaining images of edges of N imprint fields, the next step S120 includes identifying SLM pixels associated with sharp edges of cured formable material in the image 310 as shown in FIG. 5B and the left image 330 in FIG. 6. Following the identification of the SLM pixels associated with sharp edges in step S120, in step S122 the width of cured material at the sharp edges is identified as shown in FIG. 7.

Figure 7:
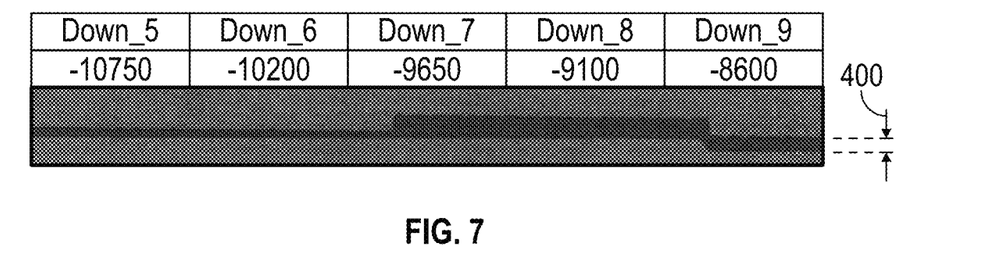
FIG. 7 is a diagram illustrating a width of cured material at an imprint field edge.

FIG. 7 shows a portion of the bottom edge of SLM cured images. The width of the pixels is represented by a width 400. In the frames Down_5 and Down_6 the width is shown as decreasing slightly in the rightward direction. Then in the frame Down_7 the width increases substantially. It is important to identify the width of the cured material at the sharp edges to determine what percentage of the pixel is within the edge. If the width of cured material is 10 micrometers wide the implication is that a larger percentage of the pixel is within the edge of the imprint field than a width of 5 micrometers. Additionally, identifying the width of cured material at the sharp edges of the imprint field has implications as to what dosage setting each pixel should be set to, to gel the formable material 152. Pixels with greater width require a lower dosage setting than pixels with a narrower width in order to gel the formable material 152. In an embodiment, the measured width of the cured material with sharp edges is used to determine the dosage which may be controlled by the duration (duty cycle) for which a pixel is turned on. In an embodiment, there is a monotonic relationship between measured width and pixel duty cycle such that an increase in width relates to a decrease in duty cycle.

Figure 8:
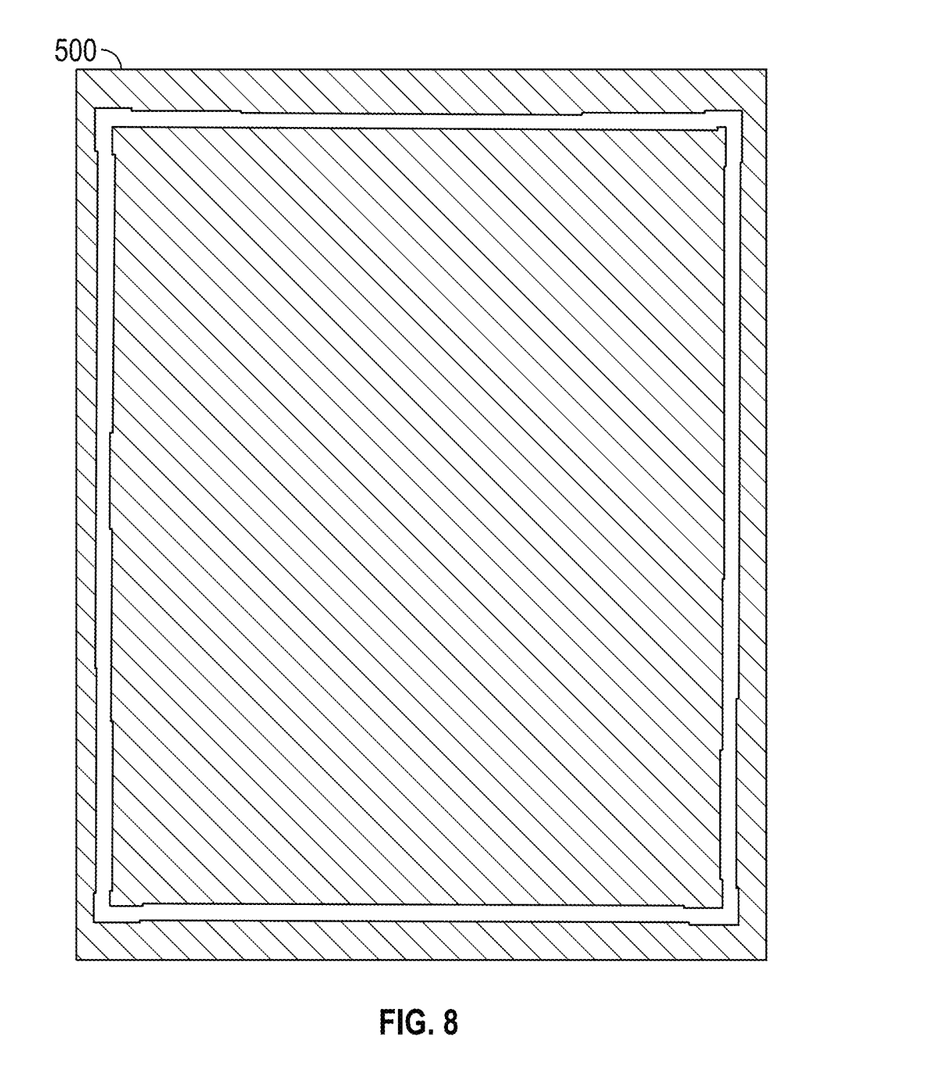
FIG. 8 is a diagram illustrating a frame cure map identifying the SLM pixels corresponding to an imprint field edge which may be generated in an exemplary embodiment.

In the flowchart of FIG. 3 after the width identification step S122, the method continues with generating a frame cure map based on the identified SLM pixels in step S124. An exemplary illustration of the frame cure map is shown in FIG. 8. An imprinting system will then control the SLM using the final modulation map to expose the edges of the imprint field to a frame like illumination pattern during the imprinting process that has been corrected for any distortions in the optical system. A frame like illumination pattern will provide actinic radiation that has an outer edge and an inner edge inset from the outer edge by 1-100 pixels.

The final frame cure map will have an outer edge that corresponds to the shape of the mesa (for example a rectangle). The final frame cure map is a diagram illustrating the impact of a SLM overall registration pattern. The SLM overall registration pattern can be used to produce the final cure map. The final cure map may include a distorted inner and outer rectangle edge 500 that produces a radiation pattern that corresponds to the mesa 146. The pattern includes a pattern of OFF pixels and ON pixels. Around the distorted rectangle 510 is the periphery positioned on top, bottom, left side, and right side of the rectangle 500. In an embodiment, some of the ON pixels are on for different durations that corresponds to the measured widths obtained in step S122.

Figure 9:
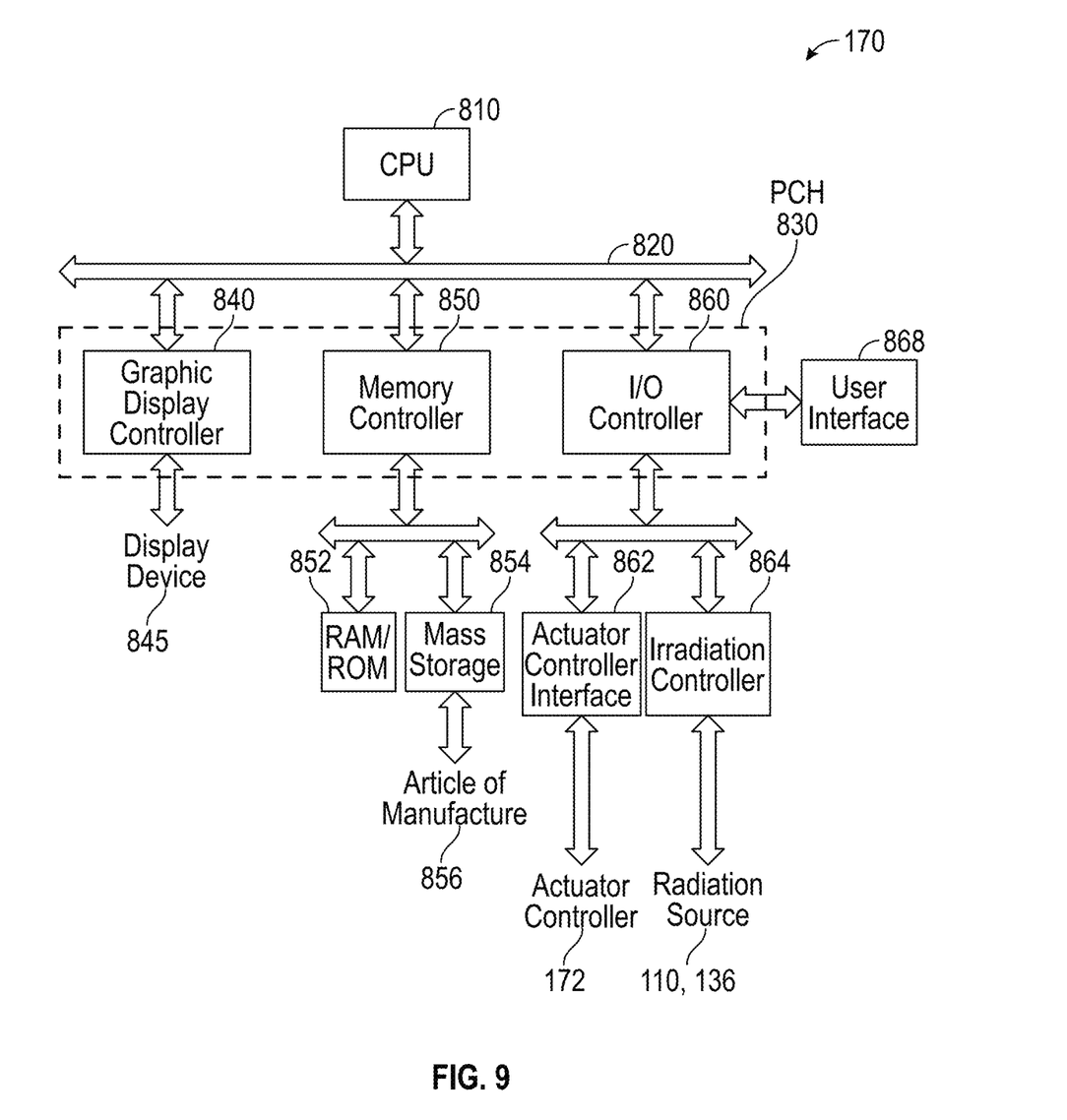
FIG. 9 is a diagram illustrating the controller.

FIG. 9 is a diagram illustrating the controller 170 shown in FIG. 1. The controller 170 includes a central processing unit (CPU) or a processor 810, a bus 820, and a platform controller hub (PCH) 830. The PCH 830 may include a graphic display controller (GDC) 840, a memory controller 850, an input/output (I/O) controller 860, and a mass storage controller 854. The processing and control system 170 may include more or less than the above components. In addition, a component may be integrated into another component. As shown in FIG. 8, all the controllers 840, 850, and 860 are integrated in the PCH 830. The integration may be partial and/or overlapped. For example, the GDC 840 may be integrated into the CPU 810, the I/O controller 860 and the memory controller 850 may be integrated into one single controller, etc.

The CPU or processor 810 is a programmable device that may execute a program or a collection of instructions to carry out a task. It may be a general-purpose processor, a digital signal processor, a programmable processor, a microcontroller, or a specially designed processor such as one design from Applications Specific Integrated Circuit (ASIC). It may include a single core or multiple cores. Each core may have multi-way multi-threading. The CPU 810 may have simultaneous multithreading feature to further exploit the parallelism due to multiple threads across the multiple cores. In addition, the CPU 810 may have internal caches at multiple levels.

The bus 820 may be any suitable bus connecting the CPU 810 to other devices, including the PCH 830. For example, the bus 820 may be a Direct Media Interface (DMI).

The PCH 830 in a highly integrated chipset that includes many functionalities to provide interface to several devices such as memory devices, input/output devices, storage devices, network devices, etc.

The I/O controller 860 controls input devices (e.g., stylus, keyboard, and mouse, microphone, image sensor) and output devices (e.g., audio devices, speaker, scanner, printer). It also has interface to a network interface card which provides interface to a network and wireless controller (not shown).

The memory controller 850 controls memory devices such as the random access memory (RAN) and/or the read-only memory (ROM) 1052, and other types of memory such as the cache memory and flash memory. The RAM 852 may store instructions or programs, loaded from a mass storage device such as a non-transitory article of manufacture 856 that contains the instructions or programs, that, when executed by the CPU 810, cause the CPU 810 to perform operations as described above. It may also store data used in the operations. The ROM 852 may include instructions, programs, constants, or data that are maintained whether it is powered or not. The instructions or programs may correspond to the functionalities described above, such as the template registration 180.

The GDC 840 controls a display device and provides graphical operations. It may be integrated inside the CPU 810. It typically has a graphical user interface (GUI) to allow interactions with a user who may send a command or activate a function. The GDC 840 may display, on the display device, images of the curing regions.

The mass storage controller 854 controls the mass storage devices such as CD-ROM and hard disk or the non-transitory article of manufacture 856.

The I/O controller 860 may include an actuator controller interface 862 and an irradiation controller 864. The actuator controller interface 862 is configured to couple to the actuator controller 172 (shown in FIG. 1). It may include switching circuits, drive circuits, and a micrometer drive. The micrometer drive may include a motorized actuator with micron, sub-micron, or sub-nano resolution. The irradiation controller 864 may include drive and timing circuits to control the radiation source 110.

Additional devices or bus interfaces may be available for interconnections and/or expansion. Some examples may include the Peripheral Component Interconnect Express (PCIe) bus, the Universal Serial Bus (USB), etc.

A manufacturing method of a device (a semiconductor device, a magnetic storage media, a liquid crystal display element, or the like) serving as an article will be described. The manufacturing method includes a step of forming a pattern on a substrate (a wafer, a glass plate, a film-like substrate, or the like) using an imprint apparatus or imprint method described above. The manufacturing method further includes a step of processing the substrate on which the pattern has been formed. The processing step may include a step of removing the residual film of the pattern. The processing step may also include another known step such as a step of etching the substrate using the pattern as a mask. The method of manufacturing the article according to this embodiment is superior to a conventional method in at least one of the performance, quality, productivity, and production cost of the article.

All or part of an embodiment may be implemented by various means depending on applications according to particular features, functions. These means may include hardware, software, or firmware, or any combination thereof. A hardware, software, or firmware element may have several modules coupled to one another. A hardware module is coupled to another module by mechanical, electrical, optical, electromagnetic or any physical connections. A software module is coupled to another module by a function, procedure, method, subprogram, or subroutine call, a jump, a link, a parameter, variable, and argument passing, a function return, etc. A software module is coupled to another module to receive variables, parameters, arguments, pointers, etc. and/or to generate or pass results, updated variables, pointers, etc. A firmware module is coupled to another module by any combination of hardware and software coupling methods above. A hardware, software, or firmware module may be coupled to any one of another hardware, software, or firmware module. A module may also be a software driver or interface to interact with the operating system running on the platform. A module may also be a hardware driver to configure, set up, initialize, send and receive data to and from a hardware device. An apparatus may include any combination of hardware, software, and firmware modules.

The method or instructions that cause the processor to perform the operations described above may be stored on a non-transitory storage medium or article of manufacture such as an optical storage device.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. A method for identifying pixels corresponding to an imprint field edge, the method comprising:
    providing a template;
    generating a set of pixel maps based on a shape of the template, each pixel map from the set of pixel maps having a plurality of columns and a plurality of rows forming a plurality of cells, each cell from the plurality of cells representing a predicted position of a corresponding pixel of a test imprint field, and each pixel map from the set of pixel maps including predicted positions for edge pixels based on the template shape to be near the imprint field edge of the test imprint field and central pixels corresponding to a center portion of the test imprint field based on the template shape, wherein the edge pixels are turned on to perform curing by irradiating a formable material, each pixel map from the set of pixel maps having different predicted positions for the edge pixels selected; and
    imprinting the test imprint field with a spatially modulated light source that is modulated with at least one pixel map from the set of pixel maps to form a cured imprint of the formable material.

2. The method according to claim 1, further comprising gap pixels represented in the set of pixel maps, the gap pixels being between the edge pixels and the central pixels, wherein the gap pixels are turned off to not cure the formable material by irradiation.

3. The method according to claim 2, wherein a minimum quantity of the gap pixels are provided between the edge pixels and the central pixels to provide a sufficient gap to identify pixel location and size relative to the imprint field edge.

4. The method according to claim 1, wherein the spatially modulated light source is a digital micromirror/mirror device (DMD).

5. The method according to claim 1, wherein the central pixels are turned on.

6. The method according to claim 1, wherein the test imprint field is a first test imprint field, further comprising:
    imprinting a recovery imprint field using an unmodulated light source in-between imprinting a second test imprint field and the first test imprint field with the spatially modulated light source.

7. The method according to claim 6, wherein the recovery imprint field, the first test imprint field, and the second test imprint field are not adjacent to one another.

8. The method according to claim 6, wherein the first test imprint field and the second test imprint field have identical shapes.

9. The method according to claim 1, wherein each row from the plurality of rows is represented by an x-axis and each column from the plurality of columns is represented by a y-axis, wherein a difference between each row/column (x, y) of the plurality of rows and columns represents a pixel pitch and a point of intersection of the x-axis and y-axis is from a center of the test imprint field.

10. The method according to claim 1, wherein the set of pixel maps are used to accurately identify the edge pixels corresponding to the imprint field edge for the template.

11. The method according to claim 1, wherein the set of pixel maps includes between 5 and 10 pixel maps, each pixel map from the set of pixel maps identifying the edge pixels corresponding to the imprint field edge based on the template shape and varying from the other pixel maps in the set of pixel maps.

12. The method according to claim 1, further comprising:
    inspecting the cured imprint with an on tool optical microscope to determine which pixels correspond to the imprint field edge for the edge of the template.

13. The method according to claim 12, further comprising:
    generating a final pixel map that selects edge pixels from the at least one pixel map determined to include pixels aligned with the imprint field edge and confirming with another imprint that all the selected edge pixels align with the imprint field edge.

14. The method according to claim 1, wherein when a pixel from the set of pixel maps is turned on, that pixel has a value greater than 0, and when a pixel from the set of pixel maps is turned off, that pixel has a value of 0.

15. An apparatus comprising:
    a processor; and
    a memory storing instructions that, when executed by the processor, cause the processor to perform operations comprising:
    providing a template;
    generating a set of pixel maps based on a shape of the template, each pixel map from the set of pixel maps having a plurality of columns and a plurality of rows forming a plurality of cells, each cell from the plurality of cells representing a predicted position of a corresponding pixel of a test imprint field, and each pixel map from the set of pixel maps including predicted positions for edge pixels based on the template shape to be near an imprint field edge of the test imprint field and central pixels corresponding to a center portion of the test imprint field based on the template shape, wherein the edge pixels are turned on to perform curing by irradiating a formable material, each pixel map from the set of pixel maps having different predicted positions for the edge pixels selected; and
    imprinting the test imprint field with a spatially modulated light source that is modulated with at least one pixel map from the set of pixel maps to form a cured imprint of the formable material.

16. A system comprising:
    a radiation source;
    a spatial light modulator (SLM) having a plurality of elements to modulate light from the radiation source;
    an imprint assembly comprising:

a template holder to hold a template;

a substrate holder to hold substrate having a surface on which a formable material is deposited;

a processor; and a memory storing instructions that, when executed by the processor, cause the processor to perform operations comprising:

generating a set of pixel maps based on a shape of the template, each pixel map from the set of pixel maps having a plurality of columns and a plurality of rows forming a plurality of cells, each cell from the plurality of cells representing a predicted position of one pixel relative to a test imprint field, and each pixel map from the set of pixel maps including predicted positions for edge pixels based on the template shape to be near the imprint field edge of the test imprint field and central pixels corresponding to a center portion of the test imprint field based on the template shape, wherein the edge pixels are turned on to perform curing by irradiating the formable material, each pixel map from the set of pixel maps having different predicted positions for the edge pixels selected; and imprinting the test imprint field with a spatially modulated light source that is modulated with at least one pixel map from the set of pixel maps to form a cured imprint of the formable material.

17. A method of manufacturing an article, the method comprising:

forming a pattern on a substrate using a method according to claim 1; and processing the substrate on which the pattern has been formed to obtain the article.

* * * * *